United States Patent [19]

Chien

[11] Patent Number: 5,667,394

[45] Date of Patent: Sep. 16, 1997

[54] ELECTRO-LUMINESCENT STRIP AND CONNECTOR SET THEREFOR

[76] Inventor: Tseng Lu Chien, 8F, No. 29, Alley 73, Lin-Shen Street, Shi-Chi Town, Taipei, Hseng, Taiwan

[21] Appl. No.: 383,404

[22] Filed: Feb. 3, 1995

[51] Int. Cl.$^6$ .................................................. H01R 9/07
[52] U.S. Cl. .................................................. 439/86; 313/512
[58] Field of Search .................................. 313/511, 512; 439/86, 495, 67, 77

[56] References Cited

U.S. PATENT DOCUMENTS

| | | | |
|---|---|---|---|
| 2,972,125 | 2/1961 | Temple et al. | 439/281 |
| 3,329,851 | 7/1967 | Braeutigam et al. | 313/512 |
| 3,430,088 | 2/1969 | Beswick | 313/512 |

Primary Examiner—Neil Abrams
Attorney, Agent, or Firm—Bacon & Thomas

[57] ABSTRACT

An electro-luminescent light strip (08) is constructed of two halves (8A,8B) separated by a gap or isolation layer, with one half consisting of, from top to bottom, a transparent conductive layer which forms the light emitting surface, a phosphor layer, an isolation layer, and a conductive layer, and the other half consisting of the same layers with the addition of a reflective layer between the isolation and conductive layers. Rather than providing electrical connection terminals on both the upper and lower conductive layers of the strip, electrical connection is established by contacting the any portion of the lowermost conductive layers (81,82) of the two halves (8A,8B) of the light strip. Contact can be made, for example, by positioning conductive rubber tubes (10,10') between conductive layers (81,82) and the stripped ends (12) of connecting wires (11) to establish an electrical connection upon attachment of a cover (07), which contains positioning slots (17,17') for the tubes and a positioning slot (08') for the light strip, to a base (06) which contains positioning slots (13,13') for the wires, the wires thereby being compressed against the tubes, and the tubes against the conductive layers. In addition, the strip can be extended by adding additional light strip portions similar to portions (8A,8B) separated by additional dielectric layers or gaps, and contact with the lowermost conductive layers of the additional portions of the strip can be established by adding additional slots (110) for the wires and additional slots (117) for the tubes. Also, instead of providing positioning slots for the wires in the base and positioning slots for the tubes in the cover, both the wires and the tubes can be positioned in slots in the base (107,207,307), and the strip can be pressed against the tubes and wires by a flat cover (306).

17 Claims, 10 Drawing Sheets

ILLUMINATION SURFACE

| | | |
|---|---|---|
| TRANSPARENT CONDUCTIVE LAYER | — LOW | 5 micron |
| PHOSPHOR LAYER | | 10 ~ 150 |
| ISOLATION LAYER | | 5 ~ 100 |
| REFLECTIVE LAYER | | 4 ~ 10 |
| CONDUCTIVE LAYER | — HIGH | 12 ~ 20 |

20 ~ 260 micron
($10^{-3}$/mm)

THEORY OF E.L. LIGHT

E.L. TRIGGER CURRENT

ELECTRO-LUMINESCENT STRIP AND CONNECTOR SET THEREFOR

BACKGROUND OF THE INVENTION

1. Field of the Invention

This invention relates to the construction of an electro-luminescent (EL) strip, and to a connector arrangement for an EL strip which permits "do-it-yourself" connection of the EL strip to a power source without the need for special skills or tooling.

2. Discussion of Related Art

EL strips are used in a wide variety of products for the purpose of enhancing their safety and attractiveness. Because they are thin, lightweight, flexible, and can be easily attached to different surfaces by adhesives or by stitching, they are ideal for use on clothing, including safety vests, belts, caps, and shoes, as well as on such diverse items as bags and vehicles. The relative brightness of the light generated by such strips, the availability of multiple colors, and the wide viewing angle allow EL strips to serve as replacement for the number of conventional light sources, including LEDs, fluorescent tubes, and gas discharge lamps, as well as ordinary incandescent bulbs.

One application for which practical problems have prevented the widespread adoption of EL strips is window or storefront signage. Although comparable in performance for neon tube lighting, current EL strips are too expensive for this application, both in terms of manufacturing costs and because the conventional EL strip packages are difficult to customize and install. This inflexibility is also a limitation in the more traditional applications, where it would also be desirable if the EL strips could be more easily cut and arranged by the customer, rather than requiring that the EL strips be manufactured in advance to particular design specifications. The present invention addresses this problem as well as the problem of cost, which is also a factor in limiting the more widespread use of EL lighting.

A conventional EL strip is operated by applying a high and a low voltage to opposite poles of a chemical layer, conventionally a phosphor, the poles being isolated to thereby create a voltage potential and a resulting electric field across the phosphor, and by varying the voltage at a characteristic excitation frequency which causes the phosphor to emit light phosphor.

Figure 1:
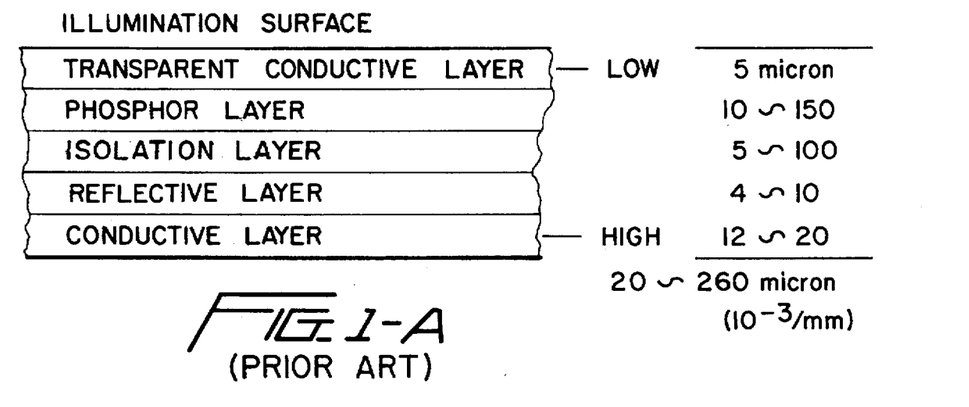
FIG. 1A is a cross-sectional view of a theoretical EL strip construction having with a conductive layer which is the same width as the remaining layers.
FIGS. 1B–1D are schematic diagrams showing the respective elements from which a conventional EL strip which has an extra-width transparent conductive layer, and also the EL strip of the preferred embodiment of the invention (which utilizes a parallel arrangement of layers) are constructed.
FIG. 1G is a schematic diagram which illustrates the theory of EL strip operation.

FIGS. 1–4 illustrate the arrangement and principles of operation of a conventional EL strip. As shown in FIG. 1-A, the conventional EL strip or panel is made up of a transparent conductive layer, a phosphor layer, an isolation layer, a reflective layer, and a conductive layer. FIG. 1-G shows the voltage drop or energy potential between the conductive and the transparent conductive layers, which is necessary to cause the phosphors to emit light energy. The brightness of the light emitted by the strip depends on the voltage applied to the phosphor layer and upon the electrical frequency. In general, the higher the voltage and the higher the frequency, the brighter the panel. The different colors can be produced by an appropriate choice of phosphors, and color can be varied for a particular phosphor by changing the frequency of the applied voltage, with increasing frequency shifting the color towards the blue end of the spectrum.

The above-noted problems with this arrangement, i.e., difficulties in manufacture and implementation, are related to one of its principal advantages, namely its lack of thickness, which results in its light weight. In the illustrated arrangement, the transparent conductive layer typically has

2 a thickness of 5 microns, the phosphor layer has a thickness of 10–150 microns, the isolation layer has a thickness of 5–100 microns, the reflective layer has a thickness of 4–10 microns, and the lower conductive layer has a thickness of 12–20 microns, for a total thickness of 36 to 280 microns or 0.036 to 0.280 inches. This lack of thickness in comparison with conventional lighting sources is one of the reasons EL strips are so attractive, but because the conventional EL panel is so thin, it is very difficult to attach terminals in order to the respective top and bottom conductive layers.

Figure 2:
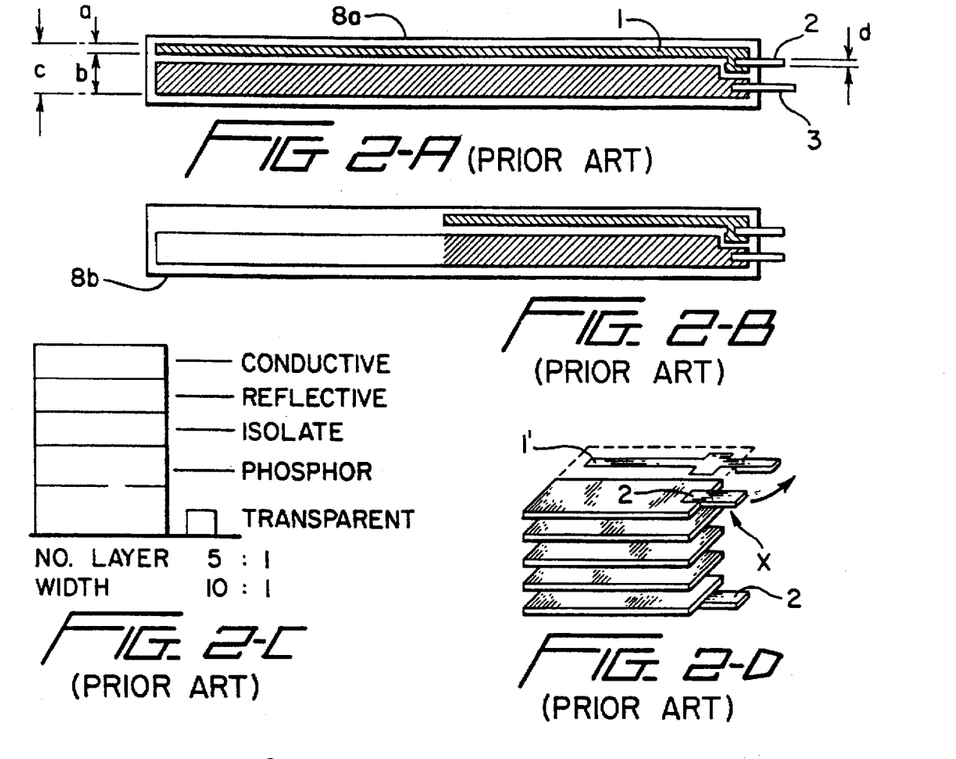

More specifically, the problem is that, if the terminals are aligned vertically, then it is impossible to prevent short circuits across the space separating the terminals, and in addition attaching wiring to the terminals is extremely difficult in such a narrow space, and thus it is conventional during manufacture to displace the upper and lower terminals laterally in the direction of arrow X, shown in FIG. 2-D by extending the width of the upper transparent conductive layer so that the terminals are no longer above one another, decreasing the danger of short circuits and leaving more room for attachment of wires to the terminals.

Although this configuration, solves some of the problems of terminal design, it has the disadvantage of preventing a uniform appearance, as is apparent from the top view shown in FIG. 2-A in which (a) represents the width of the extended portion of the transparent conductive layer, (b) represents the width of the remainder strip, (c) represents the width of the combined structure, and (d) the width of a practical terminal. In general, the width of the extended layer is one-tenth that of the remaining five layers, or 1–2 mm, as illustrated in FIG. 2-C. Furthermore, in order to reinforce the extended portion of the transparent conductive layer, and protect the transparent conductive layer from destruction due to high voltages while maintaining the necessary voltage potential between the top and bottom conductive layers, it is conventional to add a reinforcing layer of conductive adhesive, thereby increasing the cost of the strip.

The situation thus arises, in the conventional arrangement, that the easier it is to make the necessary electrical connections, due to an increase in width of the transparent conductive layer, the less attractive and higher cost of the resulting strip. While it is possible to save costs by including reinforcement in only half of the transparent conductive layer, as shown in FIG. 2-B, the resulting performance is significantly diminished.

The EL strip of the present invention, in contrast, does away with the conventional terminals and instead provides a parallel vertical configuration which simplifies electrical connections, allows the strip to be cut to any desired width, and provides a more uniform and attractive appearance. Instead of combining the transparent conductive layer represented in FIG. 1-B with the conventional arrangement shown in FIG. 1-D, the invention combines the structure shown in FIG. 1-C, in which the reflective layer is deleted but the necessary conductive and isolation layers are still included, with the conventional arrangement in a side-by-side configuration. In this arrangement, the silver-based conductive adhesive used in the conventional extended layer is not needed, reducing costs, while at the same time eliminating the non-lighted portion of the strip and providing good isolation between the terminals.

SUMMARY OF THE INVENTION

It is accordingly an objective of the invention to provide an EL strip design which overcomes the disadvantages of the prior art by providing an EL strip in which the entire length of the strip can be utilized, thus allowing the strip to be cut to conform to the requirements of the user without waste of material.

It is also an objective of the invention to provide an EL strip to which electrical connections can easily be established any where on the strip using a low-cost "do-it-yourself" connector set to provide the connections while still allowing for user customization of the strip.

It is still further objective of the invention to provide a connector set for an EL strip of the type described above which can easily be assembled by the user and adapted to a variety of difference power supplies and applications.

These objectives are accomplished by providing an EL strip made up of two different parallel but mutually isolated layer combinations, with one side using 4 layers and the other five, the two sides both having a transparent conductive layer, a phosphor layer, an isolation layer, and a conductive layer, and electrical connections being made directly to the two side-by-side conductive layers. In addition, the invention provides a unique do-it-yourself connector set specially designed to use the improved side-by-side EL strip configuration.

In a preferred embodiment of the invention, one of the multi-layer sides of the EL strip differs from the other side solely in that it has an extra reflective layer between the isolation and conductive layers. As a result, the two sides have almost the same width, with an 0.20–1.20 micron gap being provided between the sides to isolate the two sides and prevent short-circuits. No extra terminals are required in this configuration since the EL trigger current may be provided directly to the conductive surface layer of the two sides and, as a result, the strip can be cut into any desired number of segments and lengths.

The connector set of the preferred embodiment of the invention includes at least a pair of conductive rubber contacts, a first slotted housing member for supporting the EL strip and contacts, a second slotted housing member for supporting wire connections to the contacts, means for removably securing the two housing members to each other, a printed circuit board on which is mounted a control/trigger interface to the power supply.

BRIEF DESCRIPTION OF THE DRAWINGS

FIGS. 2-A and 2-B are plan views of a conventional EL strip having an extra-width transparent conductive layer.

FIG. 2-C is a schematically depicted end view further illustrating the conventional EL strip of FIGS. 2-A and 2-B.

FIG. 2-D is a perspective view of the conventional EL strip shown in FIG. 2-A to 2-C.

FIG. 3-A is a plan view of an EL strip constructed according to a first preferred embodiment of the invention.

FIG. 3-B is an end view of the EL strip shown in FIG. 3-A.

FIGS. 5-A and 5-B are, respectively, an exploded perspective view and a cross-sectional side view of the terminal construction of the EL strip of the invention.

DETAILED DESCRIPTION OF THE PREFERRED EMBODIMENTS

Figure 3:
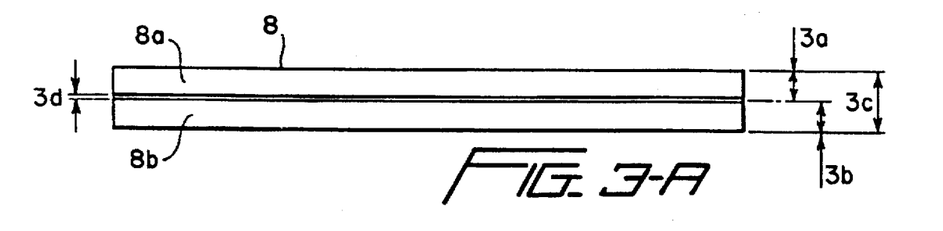

The EL strip of the preferred embodiment of the invention, as shown in FIGS. 3-A and 3-B, is made up of two parallel EL strip halves 8A and 8B. EL strip half 8A consists of, in order from top to bottom, a transparent conductive layer, a phosphor layer, an isolation layer, a reflective layer, and a conductive layer, while EL strip half 8B consists of, in order from top to bottom, a transparent conductive layer, a phosphor layer, an isolation layer, and a conductive layer. The lowermost conductive layers of halves 8A and 8B are indicated, respectively, by reference numerals 81 and 82.

Each of the layers is per se identical to corresponding layers in conventional EL strips, except that the transparent conductive layer does not include an extra-width section of the type discussed above in connection with the prior art. Unlike the conventional EL strip, however, electrical connection to the El strip of the preferred embodiment is accomplished by simply establishing a direct electrical connection with the respective lowermost conductive layers 81,82 of the two EL strip halves, with one of the conductive layers serving as the low voltage connection and the other as the high voltage connection. Electrical isolation of the two halves is obtained by providing an isolation layer or gap of approximately 0.2 to 2 mm, and preferably 0.5 to 1.0 mm, thickness between the EL strip halves.

The principal advantage of this configuration is that the electrical connection may easily be made anywhere on the lower surface of the EL strip halves, i.e., on conductive layers 81,82 so that the opposite light-emitting surface provided by the transparent conductive layers completely free from obstruction, and without the need for special terminal structures. As a result, it is possible to cut a pre-manufactured strip anywhere along the strip in order to obtain a desired shape and still provide for a do-it-yourself electrical connection to the strip.

Figure 4:
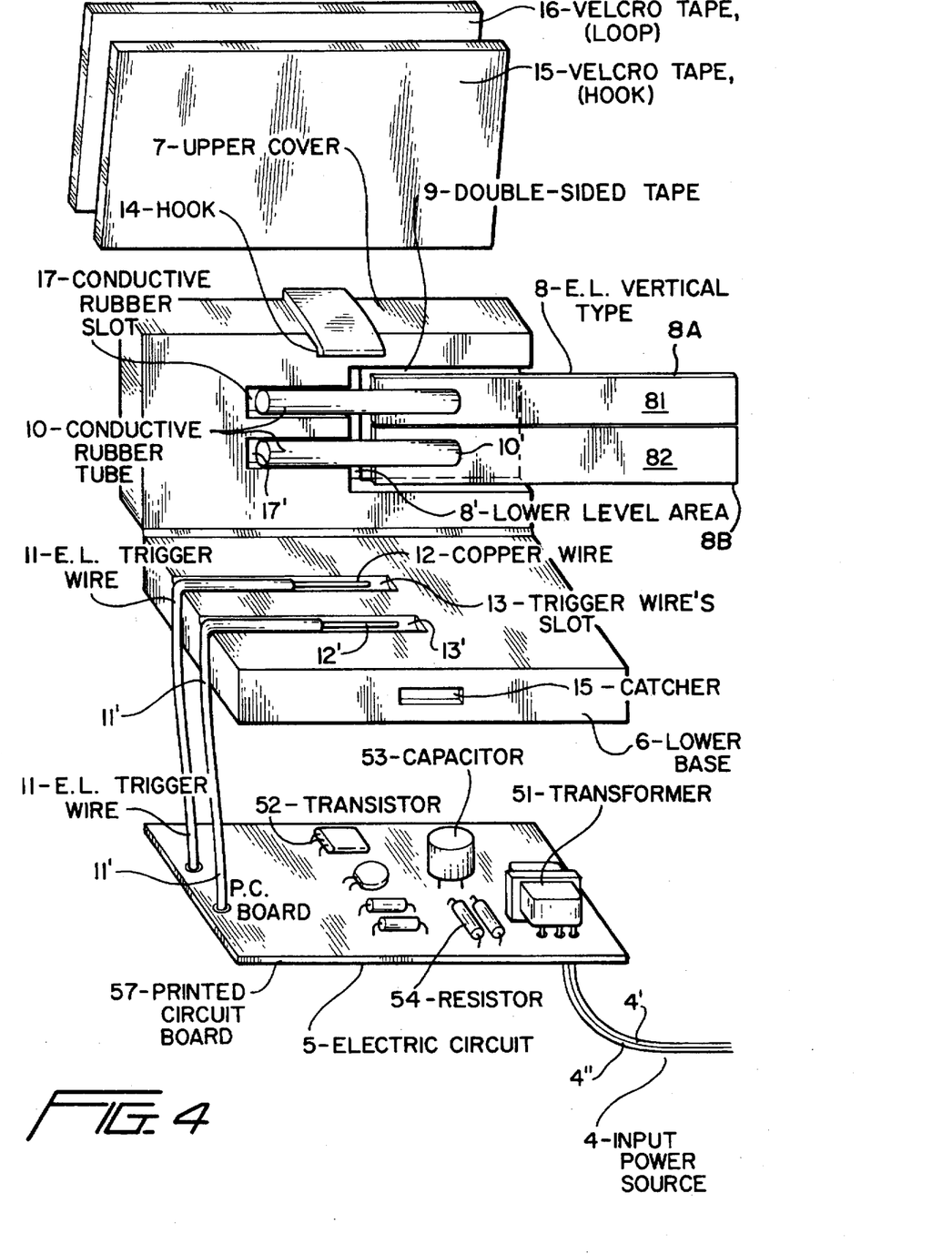
FIG. 4 is an exploded perspective view of an EL strip connector set according to a preferred embodiment of the invention.

FIG. 4 shows a universal strip connector which utilizes the panel described in connection with FIG. 3. Although this connector provides an especially convenient way to establish an electrical connection to the EL strip shown in FIGS.

3-A and 3-B, however, those skilled in the art will appreciate that the EL strip of the preferred embodiment may be used with electrical connection arrangements other than the illustrated arrangement, so long as the electrical connection arrangement used provides two electrical contacts capable of engaging the respective conductive layers of the two strip halves, and of supplying an EL trigger current thereto.

Figure 7:
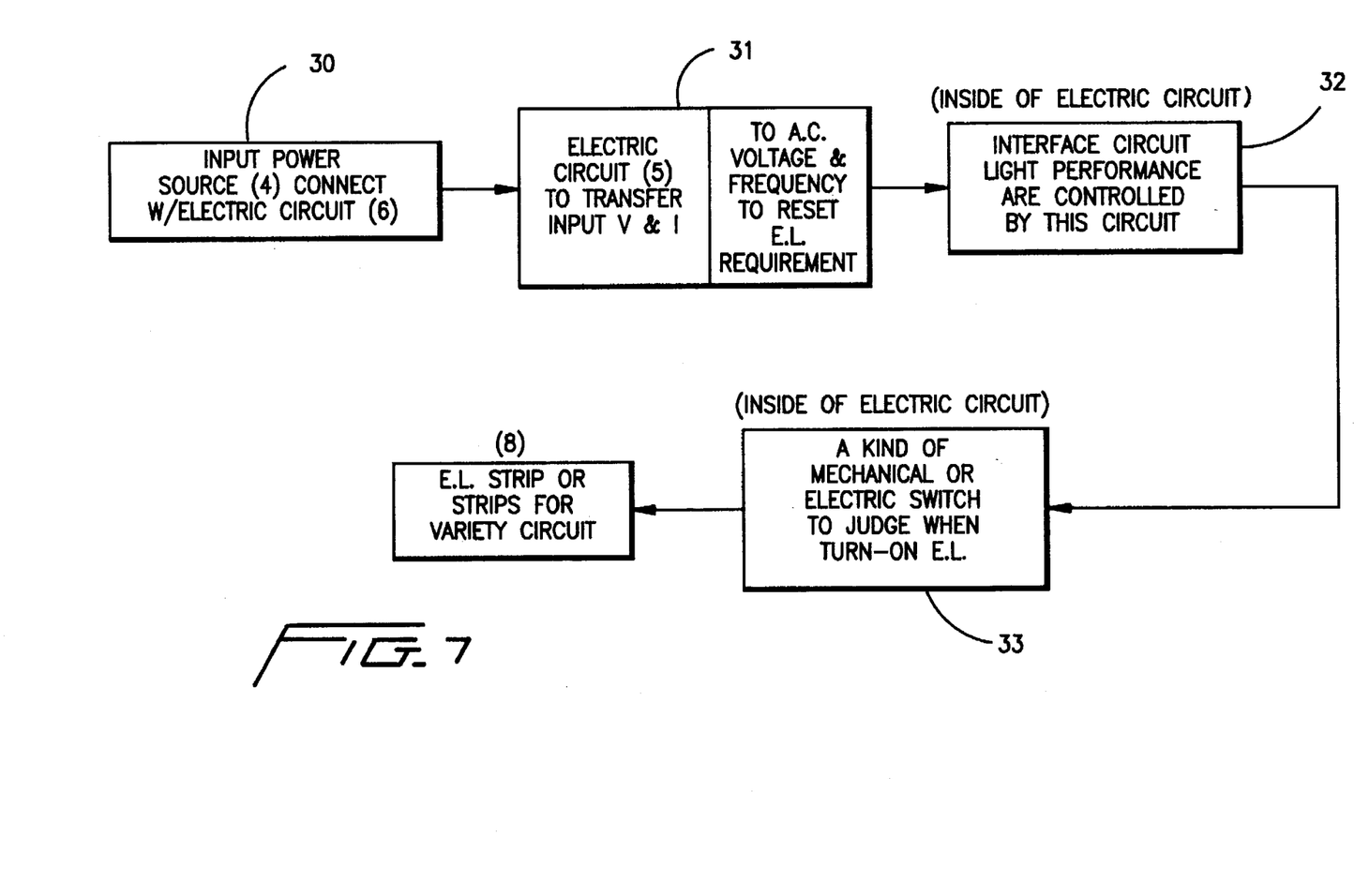
FIG. 7 is a block diagram of the principal components of the electrical system for the EL strip of the preferred embodiment of the invention.
Figure 8:
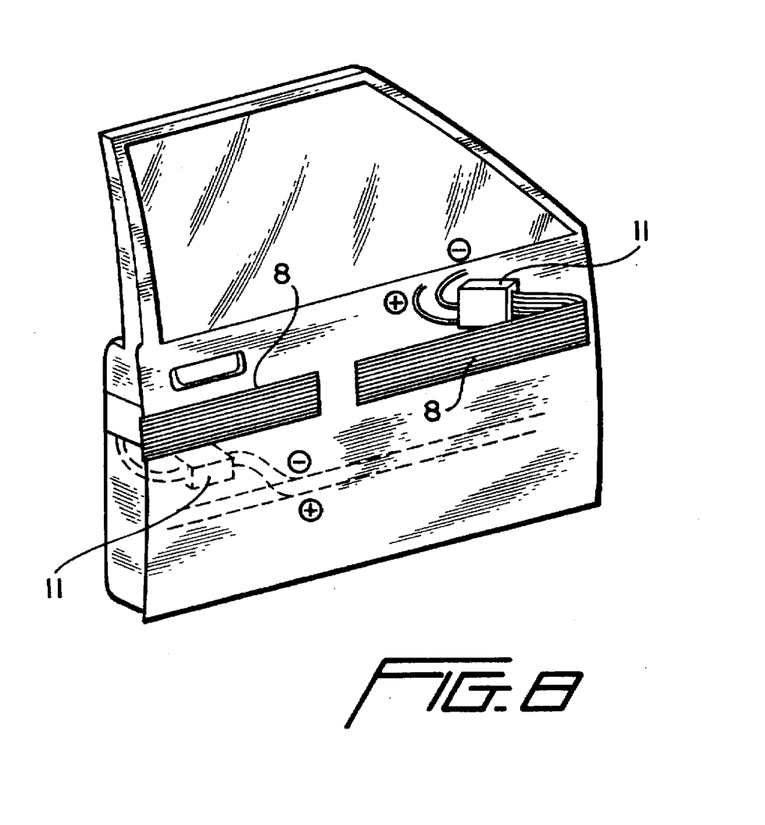
FIGS. 8–11 illustrate several applications of the preferred El strip, illustrating the advantage of customization by the consumer.
Figure 9:
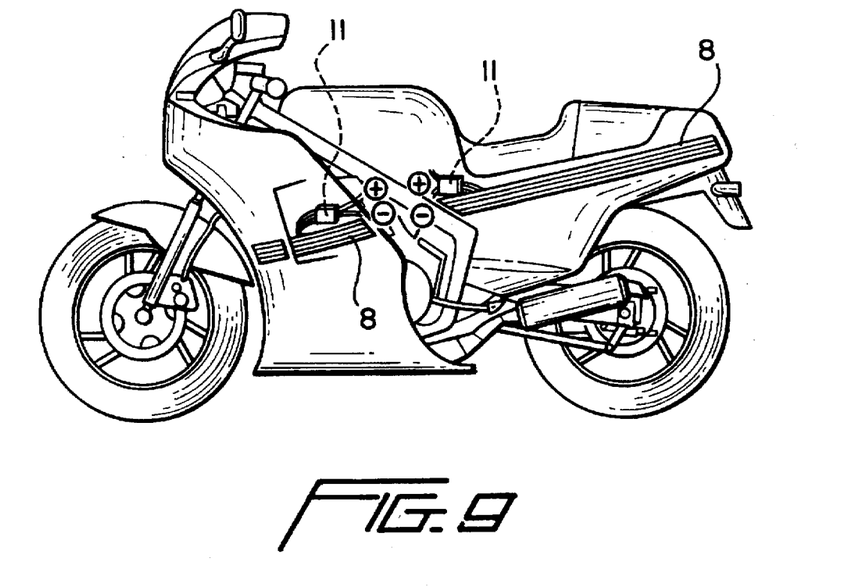
Figure 10:
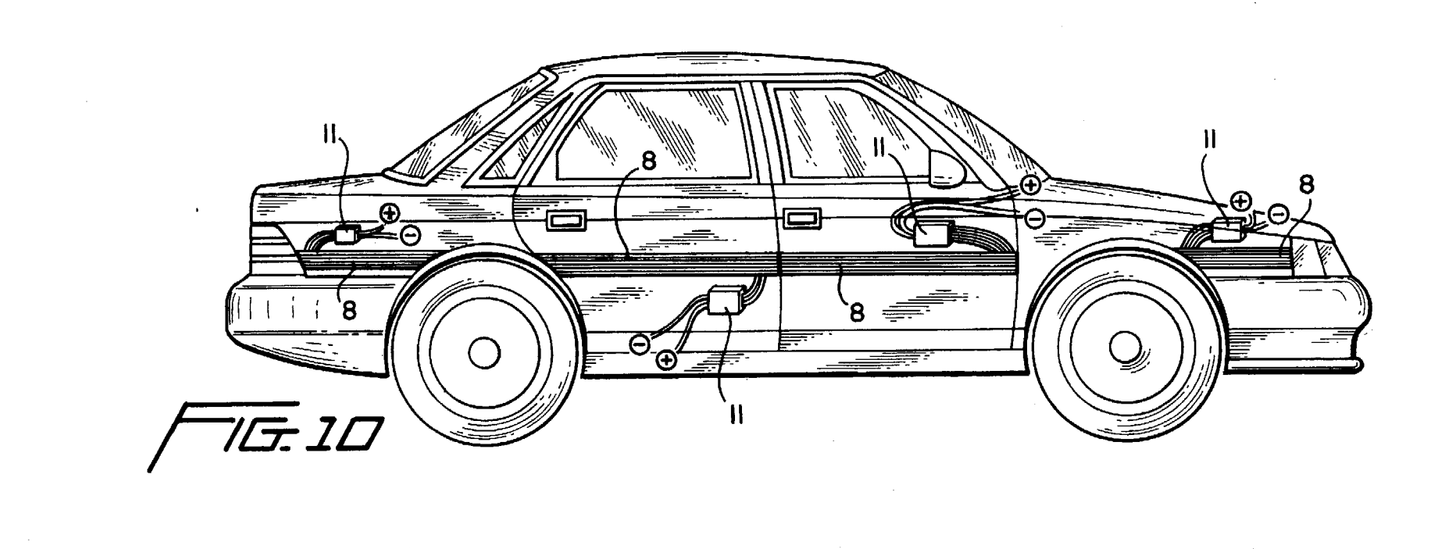
Figure 11:
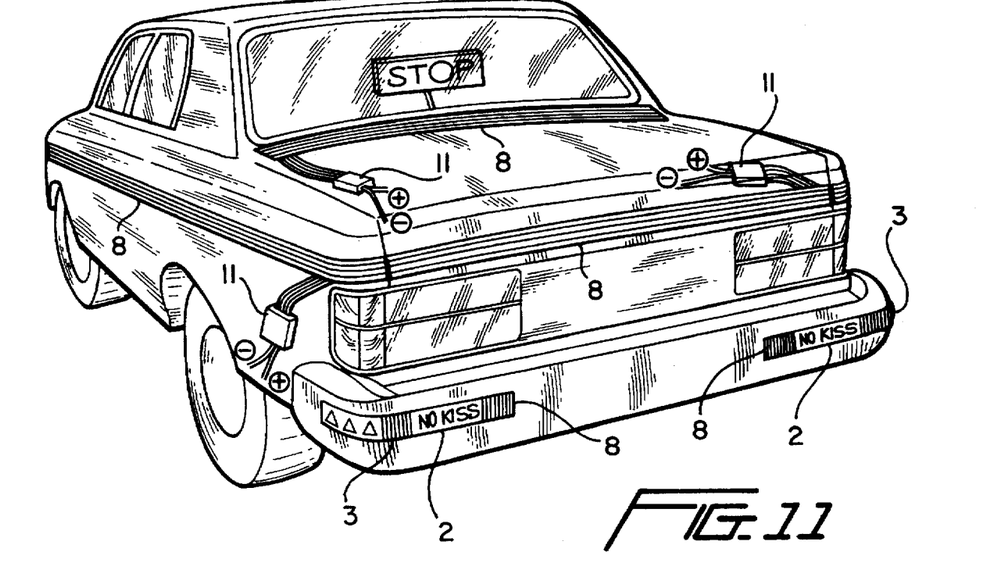

As shown in FIG. 4, the input power source for the preferred arrangement may be any kind of electrical generator, battery, or even an alternative energy source such as a solar cell, the input current being converted by electric circuit 5 to a desired AC current having a voltage of approximately 110V AC and a frequency of between 350 and 6000 Hertz for a typical application to cause the EL strip to trigger and turn on. The other illustrated components such as transistor 52, capacitor 53, and resistor 54, are used to control activation of the EL strip and can be arranged to provide, by way of example, various special effects such as flashing, fade-in/fade-out effects, chasing, sequential, and random, and steady state activation of the EL strip. A functional block diagram of a suitable power/control arrangement is shown in FIG. 7, and may include in addition to the power source 30, converter 31, control/timing circuit 32, and the EL strip 8 itself, a switch 33 for turning the circuit on and off, which may be mechanical or in the form of a timed or automatically controlled switch, such as a photosensor switch.

All of the above-mentioned electrical components, except in general for the power source, may be arranged on printed circuit board 57, with the EL trigger current being transferred to the EL strip by two electric wires 11 and 11' which are placed into two EL trigger wire slots, described below, with the two trigger wires being stripped of insulation by approximately 10 to 20 mm to expose the inside conductive wires 12 and 12'. A cut-out 8' is designed to position the EL strip 8 relative to the wires and contacts 10 and 10'.

Electrical connection between the EL strip 8 and the rubber contacts 10 and 10' is achieved by placing cylindrical conductive rubber contacts 10 and 10' in slots 13 and 13' of housing member 7, slots 17 and 17' being spaced apart so as to cause the rubber contacts to engage respective EL strip halves 8A and 8B when the EL strip is positioned in cut-out 8'. Preferably, the EL strip 8 is positioned in the cut-out 8' by means of double-sided adhesive tape, although other means of fixing the EL strip in the cut-out may also be used, including other adhesives or mechanical mounting means.

Housing member 7 is provided with a hook 14 arranged to be snapped into a corresponding opening 15 in a lower housing member 6, which includes grooves or slots 13 and 13' corresponding to slots 17 and 17' in the upper housing member 7, and which communicate therewith when the upper housing member is secured to the lower housing member by means of hook 14 and opening 15 to form passages for the rubber contacts 10 and 10' and wires 11 and 11', the wires 11 and 11' preferably having been preconnected to the circuit board 57 and situated in the slots such that stripped portions 12 and 12' are positioned to engage contacts 10 and 10'.

By dimensioning the respective slots 13, 13',17, and 17' to compress the contacts against the wires and EL strip when housing member 7 is attached to housing member 6, a secure electrical connection is established without the need for soldering or other additional electrical connection means solely by the act of securing the upper housing member to the lower housing member. Furthermore, the EL strip can easily be disconnected and replaced simply by detaching the upper housing member from the lower housing member, thus providing a connector set which can easily be assembled by any end-user to provide an electrical connection to the EL strip without the need for any special skills or tooling. Those skilled in the art will appreciate that the housing design is such that, furthermore, vibration isolation and/or weather sealing can easily be included to protect the components housed therein.

Figure 12:
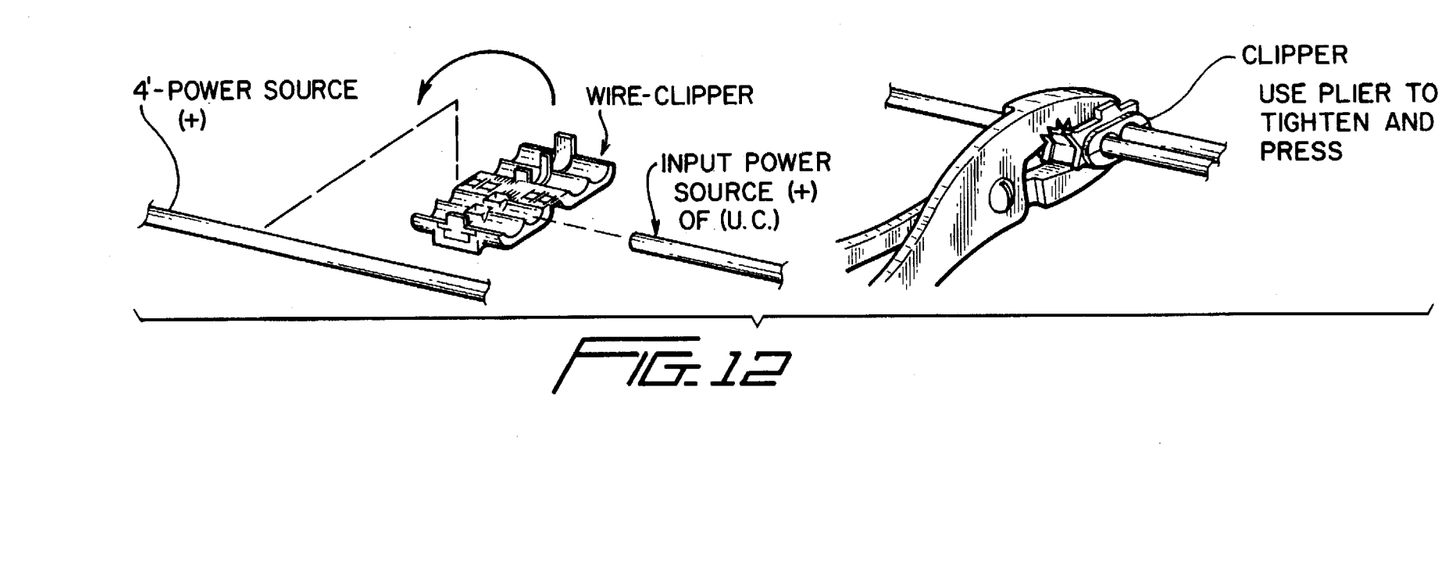
FIG. 12 illustrates the method by which the preferred EL strip arrangement may be connected to a power source.

Finally, as shown in FIG. 4, the connector may include a VELCRO hook 15 and loop 16 arrangement, if desired, for attaching the connector to another surface such as the ones shown in FIGS. 8–11, which illustrate respectively a radio, a motorcycle, and side and rear portions of an automobile (including the door, body side-molding, corners, bumper guard, and windshield), each application including various strips 8 which have been cut to desired dimensions, and a circuit housing 11, the lead wires 4 and 4' extending from the circuit board being connected to power wires in the host application by, for example, using a crimp-type connector as illustrated in FIG. 12. As is apparent from these FIGS., the EL strip and connector arrangement of the invention is extremely versatile, and provide safety and appearance enhancements in numerous different applications.

Figure 5:
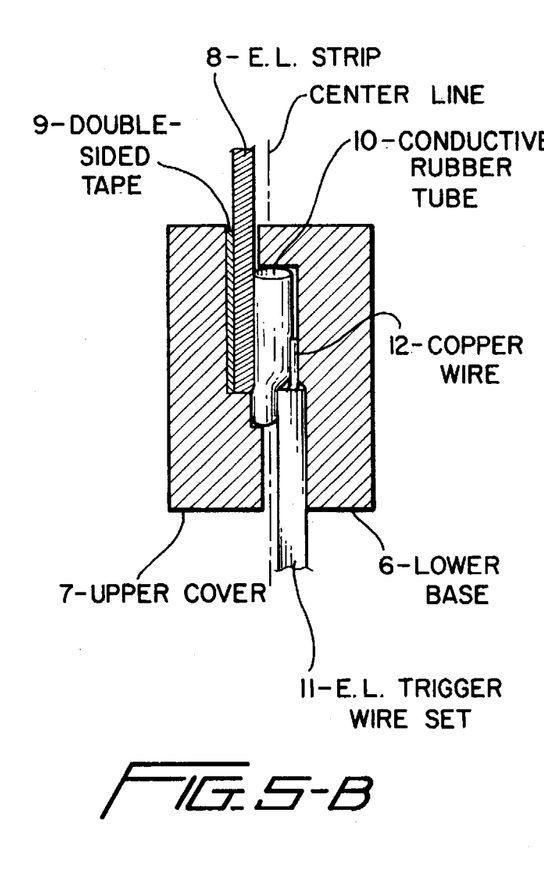
Figure 6:
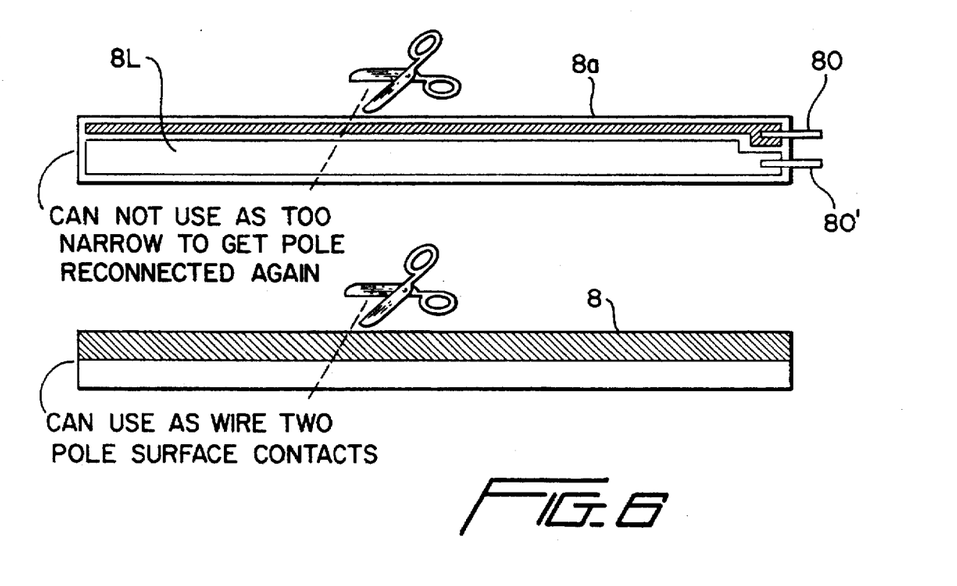
FIG. 6 includes cross-section views of the convention and preferred EL strip construction for the purpose of comparing the manner in which they may be cut.

FIG. 6 illustrates why the preferred EL strip results in much more efficient usage of the EL strip material. If the conventional strip 8a is cut, only one half will possess the original terminals 80 and 80'. Because of the difficulty in securing terminals 80 and 80' to the El strip in the first place, it is impossible for the user to use the left-hand side 8L of the strip, which does not possess the terminals and to which it would be extremely difficult to attach new terminals. In contrast, both sides of strip 8 of the preferred embodiment can be utilized after cutting by simply engaging contacts anywhere on the conductive surface, for example by using the connector illustrated in FIGS. 4, 5A, and 5B.

Figure 13:
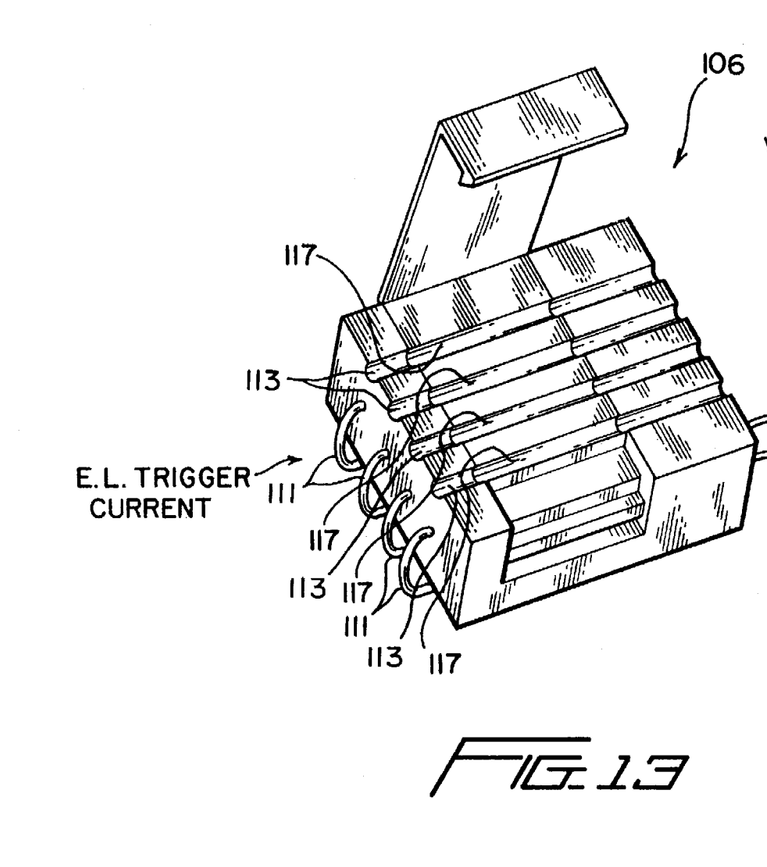
FIG. 13 is a perspective view of a multi-terminal variation of the connector set of the first preferred embodiment of the invention.
Figure 14:
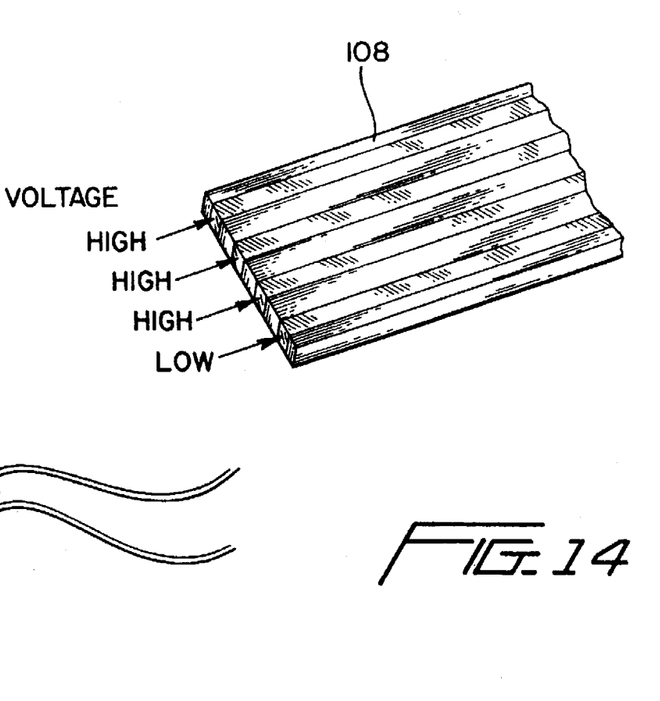
FIG. 14 is a perspective view of an EL strip having multiple "high" and "low" voltage layer arrangements for use with the connector set of FIG. 14.

The arrangement of the preferred embodiment of the invention can be further modified, as shown in FIGS. 13 and 14, to accommodate strips having multiple terminals. For example, the multiple terminal strip 108 shown in FIG. 14 may easily be constructed by repeating the sequence of a EL strip halves 8A and 8B as shown in FIG. 3, with an isolation layer or gap between each of the adjacent halves. To accommodate such a modified strip, the lower housing block 6 shown in FIG. 4 is modified to obtain a housing block 106 having multiple grooves 117, 113',113",113'" for the wires 111 and grooves 117 for the contacts (not shown in FIG. 13, but see FIG. 15), with corresponding modification to the upper housing member or cover to correspond to that shown in FIG. 16. In this configuration, those skilled in the art will appreciate that the low voltage connection may be provided by a common contact on one side of the strip, as indicated in FIG. 14.

Figure 15:
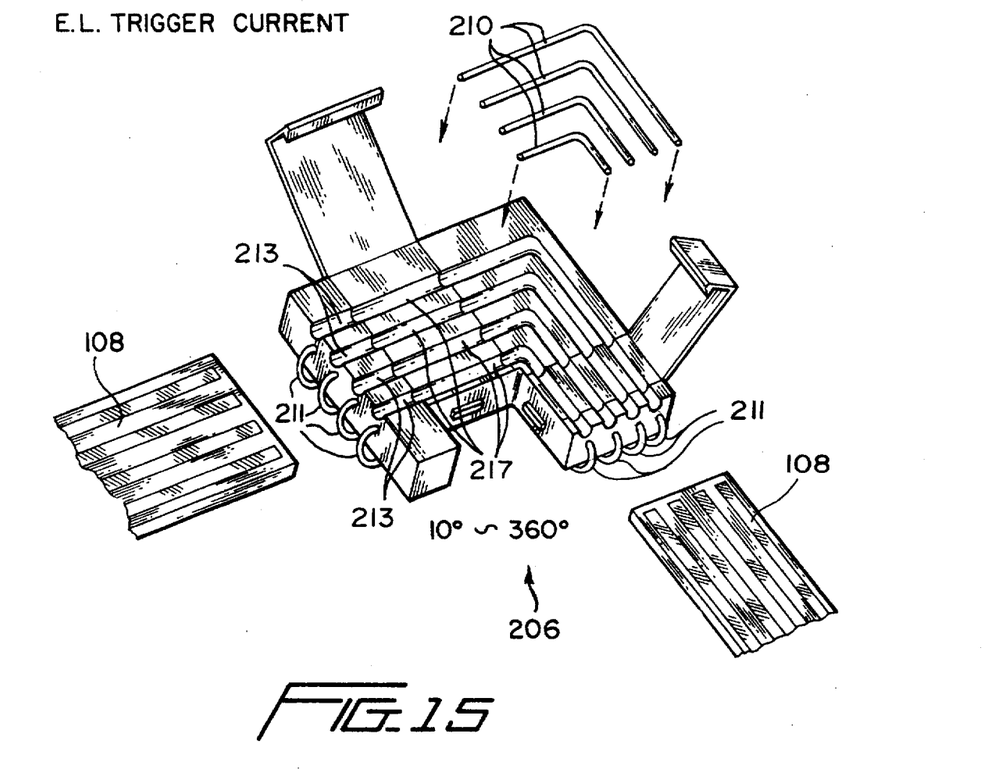
FIG. 15 is a perspective view of another multi-terminal variation of the preferred connector set.

The arrangement of FIG. 13 can be modified still further by providing, as shown in FIG. 15, for multiple EL strips in a single housing including a base 206 having positioning grooves 213 for wires 211 and positioning grooves 217 for contacts 210. Furthermore, the multiple strips can easily be positioned at an angle since the contacts 210 are flexible. This multiple EL strip/angled configuration can of course also be used for dual terminal strips of the type discussed in connection with FIG. 4. Those skilled in the art will further appreciate that the respective additional strip "halves" or sections provided in the multiple terminal strip of FIG. 14, or the multiple strips included in the embodiment of FIG. 15, may each be arranged to exhibit a different color for a more colorful visual effect.

Figure 16:
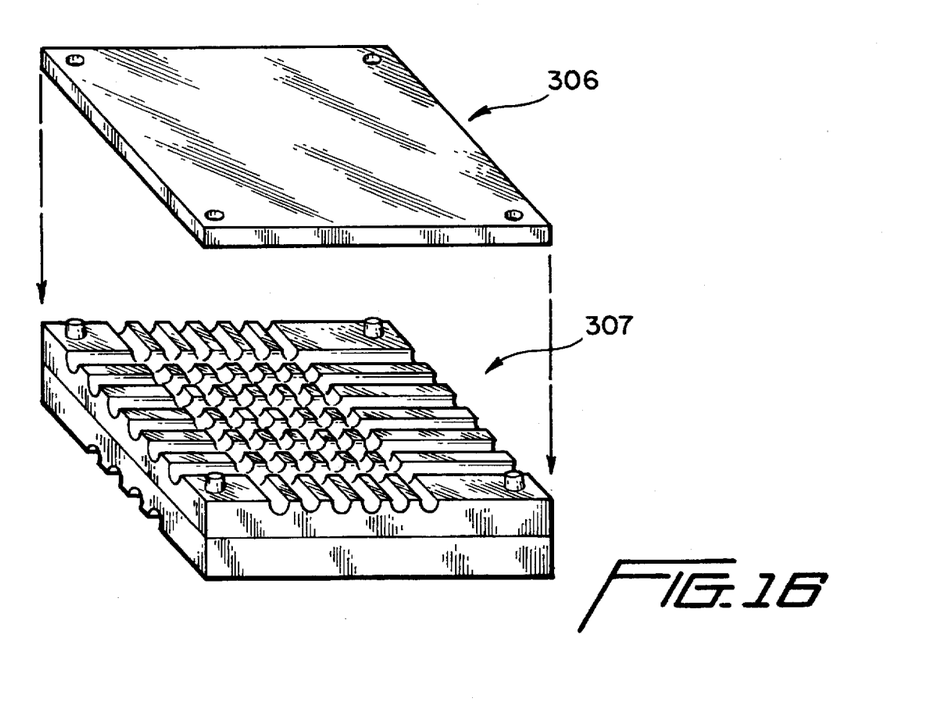
FIG. 16 is a perspective view of yet another variation of the preferred connector set.

Finally, yet another modification of the illustrated connector can be obtained by providing, in a single base 307, the possibility of using a variety of different strip configurations to be determined by the user, as illustrated in FIG. 16. In this variation, the cover 307 and base 306 having respective wire and contact positioning grooves 313 and 310 can be attached by ultrasonic welding, by a snap-on arrangement, or by any other desired interconnection means.

Having thus described a preferred embodiment of the invention and a number of different variations and modifications of the preferred embodiment, it is anticipated that still further variations and modifications will undoubtedly occur to those skilled in the art upon reading the above description, and it is therefore intended that the invention be interpreted, in accordance with the appended claims, to cover all such variations and modifications which fairly fall within the scope of the invention.

I claim:

1. A connector set for an EL light strip, comprising:
   means for positioning an EL strip;
   means for positioning a pair of lead wires;
   means for positioning a pair of compressible contacts relative to both the EL strip and the pair of lead wires; and
   first and second housing members which form a means for compressing the contacts against conductive layers of the EL strip and against the lead wires to establish an electrical connection between the lead wires and the EL strip when the second housing member is attached to the first housing member.

2. A connector set as claimed in claim 1 wherein the contacts are cylindrical conductive rubber contacts.

3. A connector set as claimed in claim 2, wherein the positioning means for the contacts comprises a pair of grooves in the second housing member, the means for positioning the EL strip comprises a cut-out in the second housing member, and the means for the pair of lead wires comprise a pair of grooves in the first housing member.

4. A connector set as claimed in claim 3, wherein the second housing member is secured to the first housing member by snapping a hook on one of the housing members into a hook on the other of the two housing members.

5. A connector set as claimed in claim 3, wherein the means for positioning the EL strip comprises a cutout in the first housing member.

6. A connector set as claimed in claim 5, wherein the EL strip is secured in the cutout by means of double-sided adhesive tape.

7. A connector set as claimed in claim 1, wherein the means for positioning the EL strip comprises a cutout in the first housing member.

8. A connector set as claimed in claim 7, wherein the EL strip is secured in the cutout by means of double-sided adhesive tape.

9. A connector set as claimed in claim 1, further comprising a circuit board on which are mounted components of a control circuit for the EL strip.

10. A connector set as claimed in claim 1, wherein the EL strip comprises:
    first and second EL strip halves each made up of a transparent conductive layer, a phosphor, an isolation layer, and a lower conductive layer, the EL strip halves being separated from each other by a gap or isolation layer,
    wherein the lower conductive layer of each of the halves is arranged to serve as a terminal for the respective half, one of the lower conductive layers being electrically connected to a low voltage trigger wire and the other to a high voltage trigger wire.

11. A connector set as claimed in claim 10, wherein the EL strip further comprises additional said halves to form EL strip having multiple terminals, one of said halves serving as a common low voltage terminal, and wherein the first housing member includes both said means for positioning said pair of lead wires and said means for positioning said compressible contacts, with one of said lead wires and one of said contacts being provided for each of said terminals.

12. A connector set as claimed in claim 11, wherein the additional EL strip halves have different colors.

13. A connector set as claimed in claim 1, further comprising means for positioning a second EL strip, means for positioning a second pair of lead wires relative to said second EL strip, and means for positioning a second pair of compressible contacts relative to said second EL strip and said second pair of lead wires such that said second pair of compressible contacts is compressed between said second pair of lead wires and said second EL strip when said first housing member is attached to said second housing member.

14. A connector set as claimed in claim 13, wherein said EL strips are positioned at a non-zero angle relative to each other.

15. A connector set as claimed in claim 14, wherein the EL strips are of different colors.

16. A connector set as claimed in claim 1, further comprising a VELCRO hook member attached to the first housing member and arranged to be attached to a complementary VELCRO loop member on an apparatus to which the strip is to be attached.

17. A connector set as claimed in claim 1, wherein the first housing member comprises a plurality of each of said positioning means to allow the connector set to be used with a plurality of different EL strip configurations.

* * * * *